(12) United States Patent
Sun et al.

(10) Patent No.: US 7,883,369 B1
(45) Date of Patent: Feb. 8, 2011

(54) RECEPTACLE CONNECTOR

(75) Inventors: Dao-Rui Sun, Guang-Dong (CN); Feng Zhu, Guang-Dong (CN); Kuo-Chin Lin, Tu-Cheng (CN)

(73) Assignee: Cheng Uei Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/711,862

(22) Filed: Feb. 24, 2010

(51) Int. Cl.
*H01R 13/648* (2006.01)

(52) U.S. Cl. ................................. 439/607.35
(58) Field of Classification Search ................. 439/665, 439/667, 607.35, 607.39, 607.55, 55, 59
See application file for complete search history.

(56) References Cited

U.S. PATENT DOCUMENTS 4,433,886 A * 2/1984 Cassarly et al. ............... 439/65
6,398,587 B1 * 6/2002 Chen et al. ............. 439/607.35
7,661,991 B1 * 2/2010 Sun ....................... 439/607.55
2009/0029567 A1 * 1/2009 Yi ................................ 439/66

* cited by examiner

*Primary Examiner*—Chandrika Prasad
(74) *Attorney, Agent, or Firm*—Cheng-Ju Chiang

(57) ABSTRACT

A receptacle connector is adapted for receiving a plug connector which includes a casing and a plurality of plug terminals disposed in the casing. The receptacle connector includes a printed circuit board and a shell mounted on the printed circuit board. Portions of a front edge of the printed circuit board are recessed inward to form two fixing grooves with a tongue formed therebetween. A plurality of golden fingers are formed on two opposite surfaces of the tongue. The shell has a top plate, a bottom plate opposite to the top plate and two side plates connecting the top plate to the bottom plate. A space is formed among the top plate, the bottom plate and the side plates and receives the tongue. The side plates are restricted in the fixing grooves. The plug connector is inserted into the space with the plug terminals electrically abutting against the golden fingers.

6 Claims, 3 Drawing Sheets

RECEPTACLE CONNECTOR

BACKGROUND OF THE INVENTION

1. Field of the Invention

The present invention generally relates to an electrical connector, and more particularly to a receptacle connector.

2. The Related Art

A conventional receptacle connector adapted for receiving a corresponding plug connector includes a receptacle connector and a printed circuit board. The receptacle connector includes an insulating housing, a plurality of receptacle terminals disposed in the insulating housing and a shell mounted onto the insulating housing. The receptacle terminals stretch out from the insulating housing to be soldered with the printed circuit board for forming an electrical connection between the receptacle connector and the printed circuit board. The corresponding plug connector includes a casing and a plurality of plug terminals disposed in the casing. The plug connector is inserted into the receptacle connector with the plug terminals electrically abutting against the receptacle terminals to form an electrical connection between the receptacle connector and the plug connector.

However, the above-mentioned receptacle connector is complicated to assemble and does not meet the modern demand of miniaturization. A receptacle connector capable of overcoming the foregoing problem is required.

SUMMARY OF THE INVENTION

An object of the present invention is to provide a receptacle connector adapted for receiving a plug connector which includes a casing and a plurality of plug terminals disposed in the casing. The receptacle connector includes a printed circuit board and a shell mounted on the printed circuit board. Portions of a front edge of the printed circuit board are recessed inward to form a pair of fixing grooves with a tongue formed therebetween. A plurality of golden fingers are formed on two opposite surfaces of the tongue. The shell has a top plate, a bottom plate opposite to the top plate and two side plates connecting the top plate to the bottom plate. A space is formed among the top plate, the bottom plate and the side plates and receives the tongue therein. The side plates are restricted in the corresponding fixing grooves. The plug connector is inserted into the space with the plug terminals electrically abutting against the golden fingers on the printed circuit board.

As described above, the receptacle connector utilizes the golden fingers formed on the printed circuit board for electrically abutting against the plug terminals of the corresponding plug connector so as to reduce the volume of the receptacle connector and facilitate the assembly of the receptacle connector.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
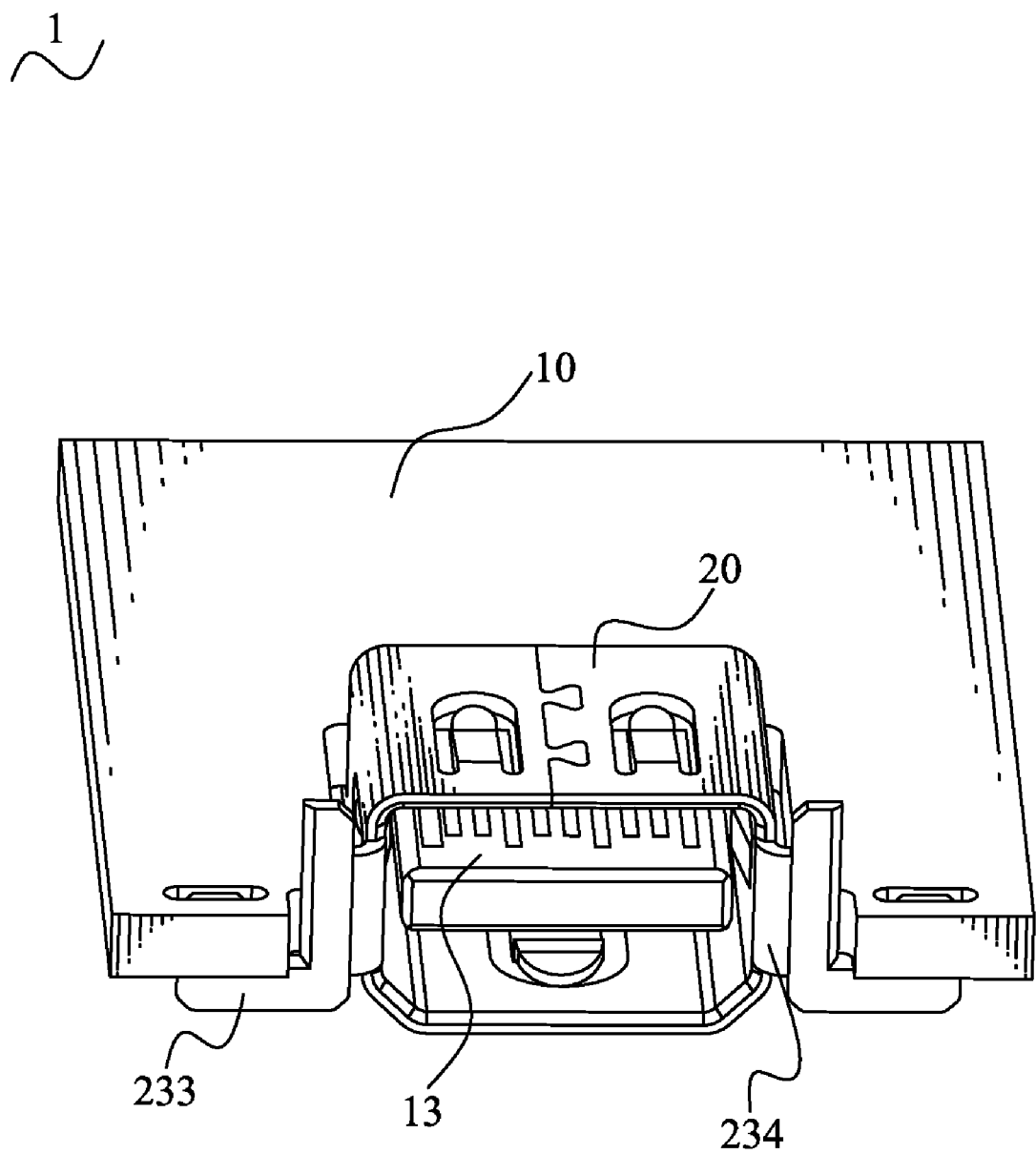
FIG. 1 is a perspective view of a receptacle connector in accordance with the present invention.

Referring to FIG. 1, a receptacle connector 1 according to the present invention is shown. The receptacle connector 1 adapted for receiving a corresponding plug connector 3 (shown in FIG. 3) includes a printed circuit board 10 and a shell 20 mounted on the printed circuit board 10.

Figure 2:
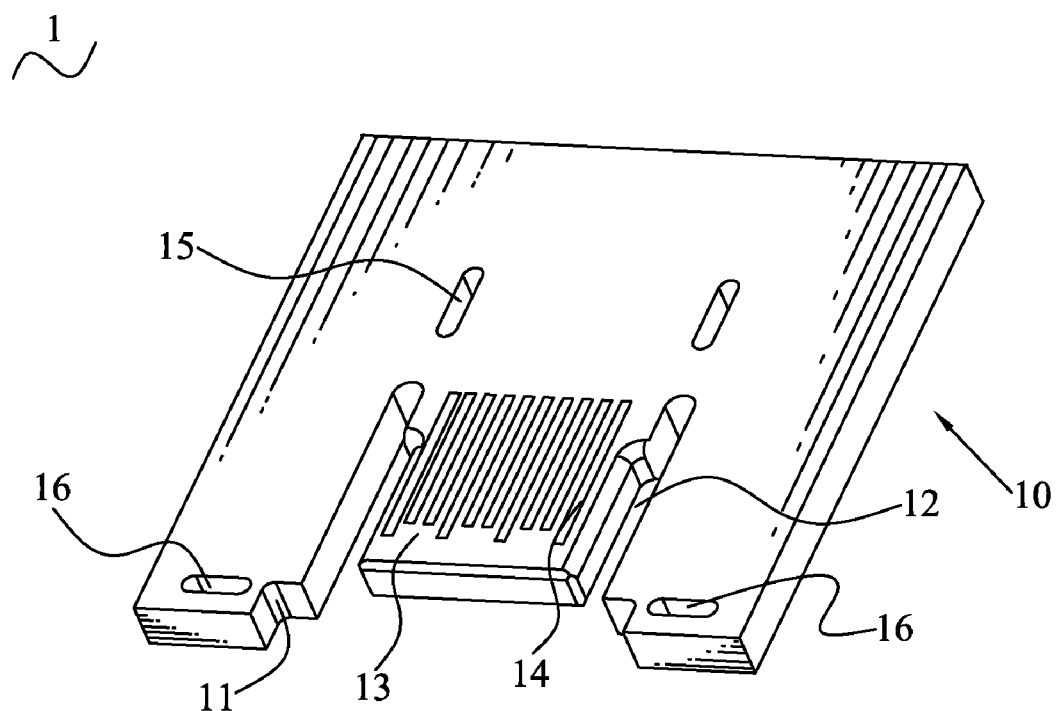
FIG. 2 is an exploded view of the receptacle connector of FIG. 1.
Figure 2:
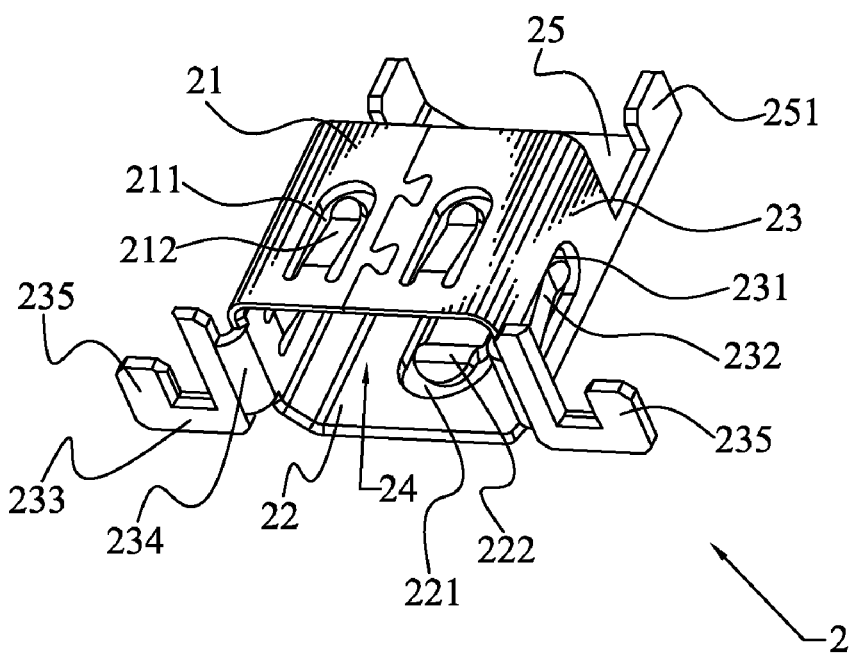

Referring to FIGS. 1-2, the printed circuit board 10 is of substantially rectangular plate shape. A middle portion of a front edge of the printed circuit board 10 is recessed inward to form a gap 11 extending transversely and vertically passing therethrough. Portions of an inmost edge of the gap 11 are further recessed inward to form a pair of spaced fixing grooves 12 each extending longitudinally. Accordingly, a substantially rectangular tongue 13 is formed between the spaced fixing grooves 12. A plurality of golden fingers 14 are formed on a top surface and a bottom surface of the tongue 13, respectively. The golden fingers 14 are arranged at regular intervals along a transverse direction and each extending longitudinally. The printed circuit board 10 defines a pair of first slits 15 positioned in rear of and substantially in alignment with the respective fixing grooves 12 and each extending longitudinally, and vertically passing therethrough. The printed circuit board 10 further defines a pair of spaced second slits 16 adjacent to the front edge thereof and with the fixing grooves 12 located therebetween. Each of the second slits 16 extends transversely and vertically passes through the printed circuit board 10.

Referring to FIGS. 1-2, the shell 20 has a top plate 21, a bottom plate 22 opposite to the top plate 21, and two side plates 23 connecting the top plate 21 and the bottom plate 22. Accordingly, a space 24 is formed among the top plate 21, the bottom plate 22 and the two side plates 23. A rear edge of the bottom plate 22 extends rearward to form a bottom rear plate 25. Two side edges of a rear of the bottom rear plate 25 are bent upward to form a pair of substantially rectangular first holding portions 251 facing each other and each extending longitudinally with a rear edge thereof being placed in a substantial same plane as that of the bottom rear plate 25. The top plate 21 defines a pair of spaced first openings 211 passing therethrough and each extending longitudinally. A front edge of the first opening 211 extends towards a rear edge thereof to form a first elastic arm 212 with a free end thereof being arched into the space 24. The bottom plate 22 defines a second opening 221 passing therethrough and extending longitudinally. A rear edge of the second opening 221 extends towards a front edge thereof to form a second elastic arm 222 with a free end thereof being arched into the space 24. Each of the side plates 23 defines a third opening 231 passing therethrough and extending longitudinally. A front edge of the third opening 231 extends towards a rear edge thereof to form a third elastic arm 232 with a free end thereof being arched into the space 24. A front edge of each of the side plates 23 connects an outward substantially L-shaped connecting portion 233 with a vertical part perpendicular to the side plate 23 and an arc spring portion 234 smoothly connecting middle portions of the front edge and the vertical part of the connecting portion 233. A distal end of a level part of the connecting portion 233 is slightly extended upward to form a second holding portion 235.

Referring to FIGS. 1-2 again, in assembly, the shell 20 is mounted on the printed circuit board 10 along a front and rear direction with the tongue 13 of the printed circuit board 10 entering into the space 24 of the shell 20. When the shell 20 is completely assembled with the printed circuit board 10, the tongue 13 is received in a middle of the space 24. The top plate 21 is suspended over the tongue 13 and the bottom plate 22 is under the tongue 13. The two side plates 23 are restricted by the corresponding fixing grooves 12 with the vertical parts of the connecting portions 233 abutting against the inmost edge of the gap 11 and the second holding portions 235 held into the corresponding second slits 16. The bottom rear plate 25 is located under a rear of the printed circuit board 10 with the first holding portions 251 held into the corresponding first slits 15.

Figure 3:
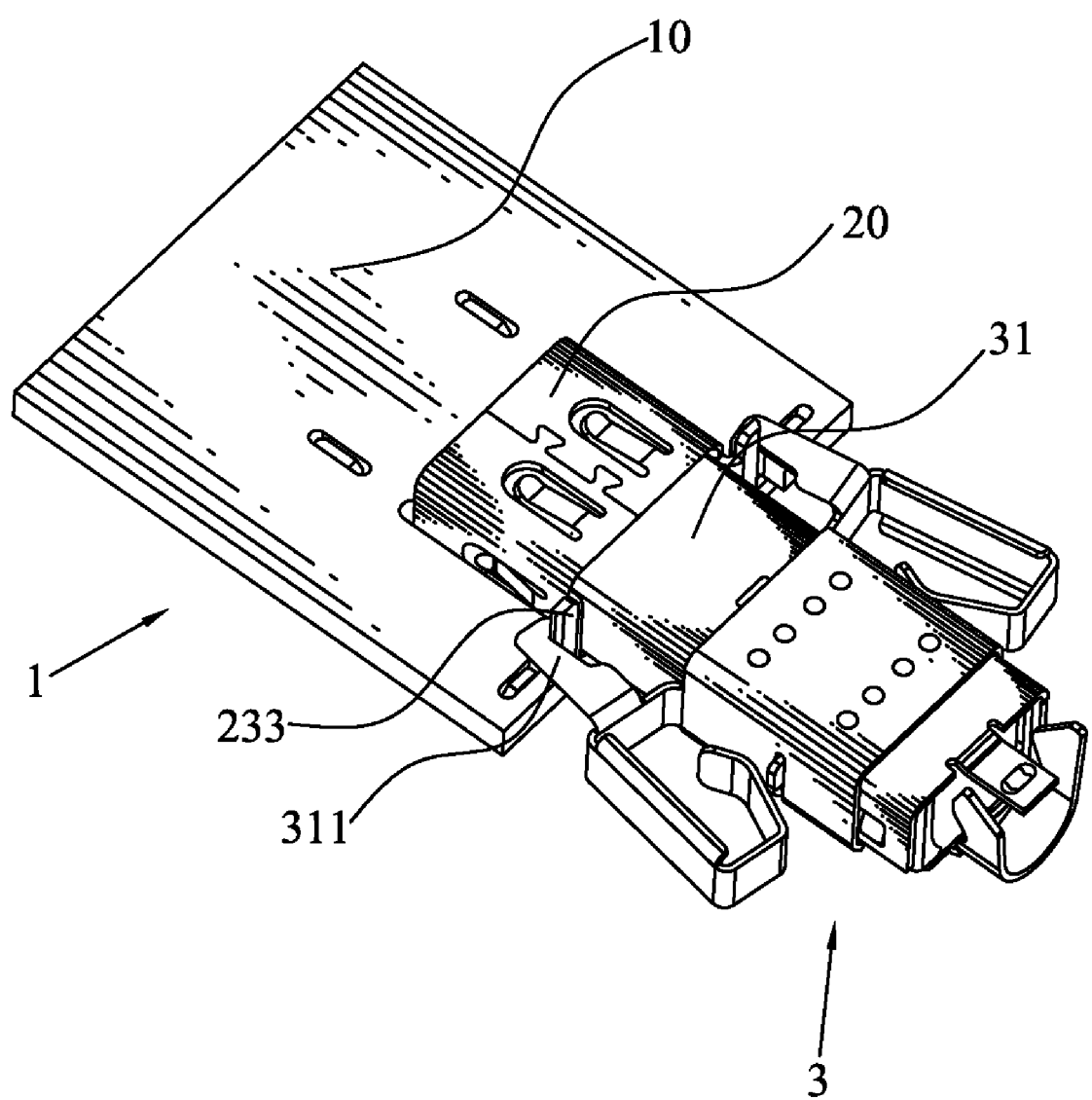
FIG. 3 is another perspective view of the receptacle connector of FIG. 1, in which a corresponding plug connector is inserted.

Referring to FIG. 3, the corresponding plug connector 3 includes a casing 31 defining a pair of hooks 311 at two opposite sides thereof and a plurality of plug terminals (not shown) received in the casing 31. When the plug connector 3 is inserted into the receptacle connector 1, a rear of the plug connector 3 is inserted into the space 24 of the receptacle connector 1. The plug terminals electrically abut against the golden fingers 14 formed on the printed circuit board 10 so as to form an electrical connection between the plug connector 3 and the receptacle connector 1. The hooks 311 are hooked with the vertical parts of the connecting portions 233 to form a firm engagement between the plug connector 3 and the receptacle connector 1. The spring portion 234 is formed for providing elasticity to the connecting portion 233 when the plug connector 3 is assembled with the receptacle connector 1 so as to protect the connecting portion 233 and make the assembly between the plug connector 3 and the receptacle connector 1 more stable. The elastic arms 212, 222, 232 abut against the casing 31 of the plug connector 3 for making the plug terminals electrically abut against the golden fingers 14 more firmly so as to make the electrical connection between the receptacle connector 1 and the plug connector 3 more stable.

As described above, the receptacle connector 1 utilizes the golden fingers 14 formed on the printed circuit board 10 for electrically abutting against the plug terminals of the corresponding plug connector 3 so as to reduce the volume of the receptacle connector 1 and facilitate the assembly of the receptacle connector 1.

The forgoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A receptacle connector adapted for receiving a plug connector which includes a casing and a plurality of plug terminals disposed in the casing, the receptacle connector comprising:
   a printed circuit board, portions of a front edge of the printed circuit board being recessed inward to form a pair of fixing grooves with a tongue formed therebetween, a plurality of golden fingers being formed on two opposite surfaces of the tongue; and
   a shell mounted on the printed circuit board, the shell having a top plate, a bottom plate opposite to the top plate and two side plates connecting the top plate to the bottom plate, a space being formed among the top plate, the bottom plate and the side plates and receiving the tongue therein, the side plates being restricted in the corresponding fixing grooves, wherein the plug connector is inserted into the space with the plug terminals electrically abutting against the golden fingers on the printed circuit board.

2. The receptacle connector as claimed in claim 1, wherein one of the top plate, the bottom plate and the side plates of the shell defines an opening, an edge of the opening extends towards an opposite edge of the opening to form an elastic arm with a free end being arched into the space for abutting against the casing of the plug connector.

3. The receptacle connector as claimed in claim 1, wherein the printed circuit board defines two first slits behind of and substantially in alignment with the corresponding fixing grooves, a rear edge of the bottom plate extends rearward to form a bottom rear plate with two side edges thereof being bent perpendicularly to form first holding portions held into the corresponding first slits.

4. The receptacle connector as claimed in claim 1, wherein the printed circuit board defines two spaced second slits adjacent to the front edge thereof and with the fixing grooves located therebetween, a front edge of each of the side plates connects an outward substantial L-shaped connecting portion, a distal end of a level part of the connecting portion is extended upward to form a second holding portion held into the corresponding second slit.

5. The receptacle connector as claimed in claim 4, wherein the front edge of the side plate and a vertical part of the connecting portions are connected by an arc spring portion.

6. The receptacle connector as claimed in claim 4, wherein the front edge of the printed circuit board is recessed inward to form a gap located between the second slits, portions of an inmost edge of the gap are further recessed inward to form the fixing grooves, vertical parts of the connecting portions abut against the inmost edge of the gap.

* * * * *